United States Patent [19]

Itoh et al.

[11] 4,392,227
[45] Jul. 5, 1983

[54] TERRACED SUBSTRATE SEMICONDUCTOR LASER

[75] Inventors: Kunio Itoh, Uji; Takashi Sugino; Masaru Wada, both of Takatsuki; Hirokazu Shimizu, Toyonaka, all of Japan

[73] Assignee: Matsushita Electric Industrial Co., Ltd., Kadoma, Japan

[21] Appl. No.: 224,821

[22] Filed: Jan. 13, 1981

[30] Foreign Application Priority Data

| | | |
|---|---|---|
| Jan. 14, 1980 [JP] | Japan | 55-2777 |
| Feb. 5, 1980 [JP] | Japan | 55-13159 |
| Feb. 19, 1980 [JP] | Japan | 55-20256 |
| Mar. 14, 1980 [JP] | Japan | 55-32981 |
| Mar. 19, 1980 [JP] | Japan | 55-35292 |
| Mar. 19, 1980 [JP] | Japan | 55-35293 |
| Mar. 19, 1980 [JP] | Japan | 55-35296 |
| May 16, 1980 [JP] | Japan | 55-65555 |

[51] Int. Cl.³ ............................................... H01S 3/19
[52] U.S. Cl. ........................................ 372/46; 357/17
[58] Field of Search ..................... 372/45, 46; 357/17

[56] References Cited

U.S. PATENT DOCUMENTS 4,288,757  9/1981  Kajimura et al. ..................... 372/46

OTHER PUBLICATIONS

Itoh et al., "Semiconductor Lasers Overcome All Deficiencies", *JEE*, Jun. 1979, pp. 30-33.

*Primary Examiner*—James W. Davie
*Attorney, Agent, or Firm*—Cushman, Darby & Cushman

[57] ABSTRACT

In a terraced substrate type semiconductor laser comprising a semiconductor substrate (11) having a step (T) on its principal face, an active layer (13) with an oblique central region (131), defined between two bendings, as stripe-shaped lasing region near the foot of the step part (T) of the substrate (11), and a clad layer (14) formed on the active layer (13), The device is characterized by comprising a current injection region (22) which is formed by diffusing an impurity, in a manner that a diffusion front corner (221) penetrate the clad layer (14) and contacts the oblique lasing region (131) thereby to form the current injection path (221) very narrow and closely to the central part of the stripe-shaped lasing region (13), thereby effectively confining the injected current to the lasing region (131) and hence attaining very low threshold current and very high external differential quantum efficiency.

15 Claims, 49 Drawing Figures

(PRIOR ART III)

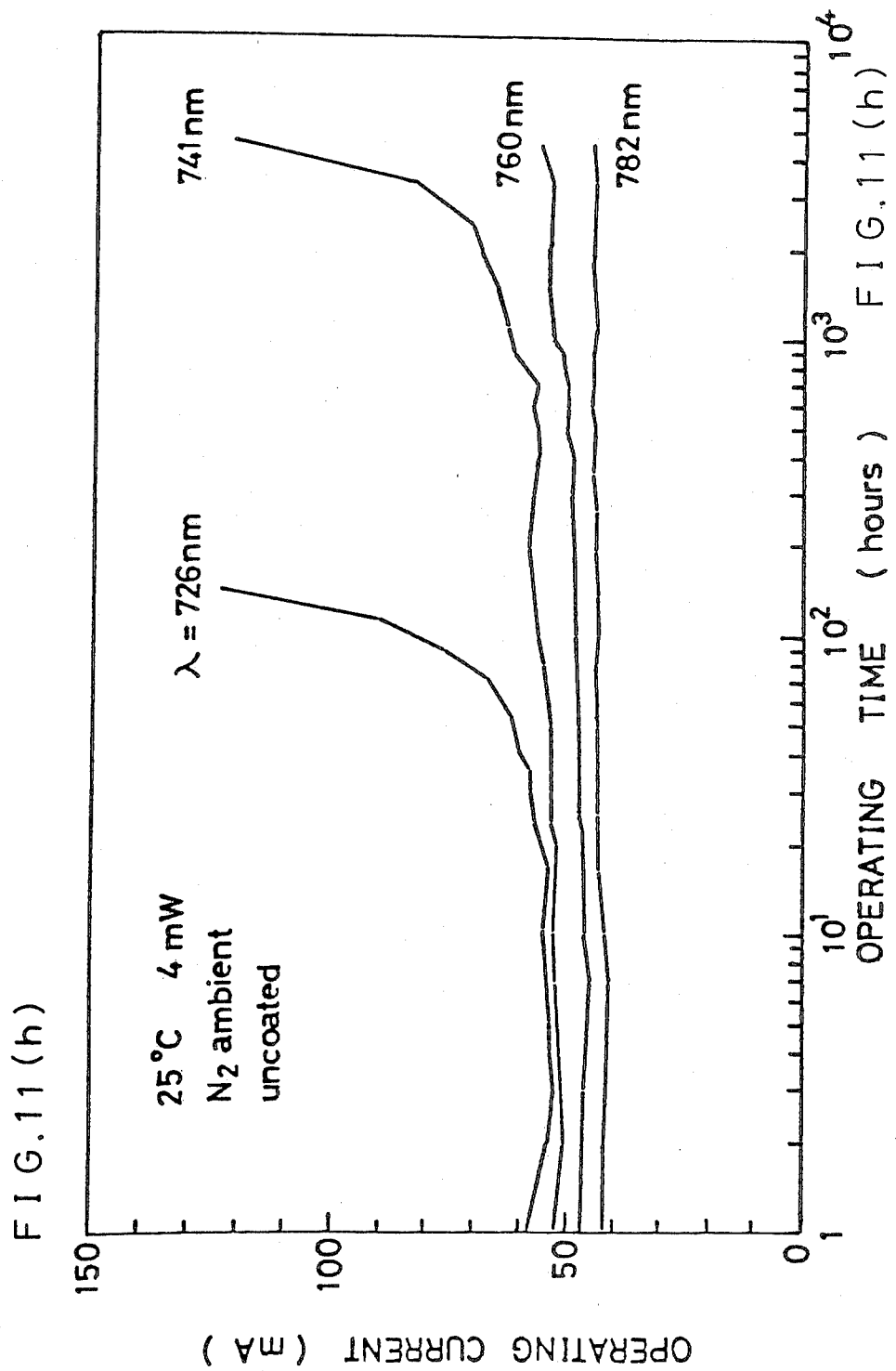

TERRACED SUBSTRATE SEMICONDUCTOR LASER

BACKGROUND OF THE INVENTION

1. Field of the Invention

The present invention relates to an improvement in a semiconductor laser of a terraced substrate type.

2. Description of the Prior Art

A semiconductor laser has the advantage of smallness of bulk, high efficiency and direct modulation by means of its current, and therefore has a bright future as light sources for optical communication, optical data processing. A laser for such use necessitates characteristics of stable fundamental transverse mode lasing, low threshold current, high output of light and high reliability.

The conventional laser which has a structure of simple gain guiding has a difficulty in maintaining a transverse mode for a wide range of current, and therefore is liable to occurrence of undesirable mode conversion or a generation of higher modes. As a result of these, the light-current characteristic is likely to have a kink of characteristic curve or the device is likely to have a multiple lengthwise mode oscillation.

FIG. 1, FIG. 2 and FIG. 3 show various types of a conventional semiconductor stripe laser, wherein FIG. 1 shows a planar stripe laser. The laser of FIG. 1 has a doublehetero structure which has on a substrate 1 of . . . n-GaAs
a first clad layer 2 of . . . n-GaAlAs,
an active layer 3 of . . . non-doped GaAs,
a second clay layer 4 of . . . p-GaAlAs and
an isolation layer 5 of . . . n-GaAlAs, which forms a p-n isolation junction between it and the underlying p-type second clad layer 4 and has a
stripe shaped current injection region 6 of . . . p-type diffused region formed by diffusing an acceptor such as Zn, in a manner to penetrate it and diffuse into the midway of the second clay layer.

Numeral 7 and 8 designate p-side and n-side electrode ohmicly contacting the current injection region 6 and the substrate 1, respectively.

In such planar stripe laser, the active layer has a flat structure and has uniform refractive index on all parts thereof. Therefore, the light confinement in the stripe shaped region is not sufficient. Besides, current injected from the current injection region 6 is likely to spread as shown by the curve I of FIG. 1 and spread parts around both sides of the curve which does not contribute to the oscillation. As the width W becomes narrower until the width W becomes 7 $\mu$m, the threshold current gradually decreases. However, it is found that when the width becomes smaller than 7 $\mu$m, the threshold current of the laser increases. This is supposed that for the width W of smaller than 7 $\mu$m, spreading current which flows at both side parts of the curve I increases in relation to the effectual current which flows at the center of the curve I. Furthermore, when the injected current is increased, the light distribution becomes, as shown by curve II of FIG. 1, that is strong light intensities appear on both side parts, resulting in oscillations on these side parts thereby losing uniformity of oscillation.

FIG. 2 shows a structure of another conventional laser, wherein the substrate 1 has a groove 10 of a stripe shaped pattern and on such substrate 1 a first clad layer 2 and an active layer 3 and known subsequent layers 4 and 5 are formed. In this laser, the stability of single mode oscillation is improved over that the laser of FIG. 1; but the structure of the active layer per se is still flat like the structure of FIG. 1, that is, there is no means to limit spreading of the injected current. Accordingly, its threshold current is not sufficiently reduced.

FIG. 3 shows still another example of the conventional laser, which has been proposed by some members of the inventors of the present invention. One example of this laser has a terrace shaped substrate 11 of . . . n-GaAs, and thereon epitaxial layers of
a first clad layer 12 of . . . n-Ga$_{1-x}$Al$_x$As, an active layer 13 having an oblique
lasing region 131 of . . . (non-doped) Ga$_{1-y}$Al$_y$As,
a second clad layer 14 of . . . p-Ga$_{1-x}$Al$_x$As and
a cap layer 15 of . . . p-GaAs.

Thereon are formed insulation layers 16 and 16 of, for example, an SiO$_2$ having a stripe shaped opening at the position above the oblique active region 131. And electrodes 18 and 17 are formed on the p-side and n-side of the substrate. In this prior art, the active layer has an oblique lasing region 131 defined by an upper bending part and a lower bending part which confines light therebetween, and the first clad layer 12 has a triangular thick part 121 under the oblique lasing region 131 and upper thinner part and a lower thinner part under an upper horizontal part and a lower horizontal part of the active layer 13, respectively. Therefore the thicker part 121 of the first clad layer 12 serves to prevent absorption of light into the substrate 11, while the thinner parts of the first clad layer 12 serves to allow absorption of light therethrough into the substrate 11. Therefore, by the difference of the light absorption from the active layer 13 to the substrate 11, the light is effectively confined in the lasing region 131 which is on the thicker part 121 and between the two bending parts, and thereby a single transverse mode oscillation is easily obtainable, the manufacture thereof is easy and life time thereof is long because of reasonable crystal structure. However, the terraced substrate laser structure of FIG. 3 still has a problem that some part of the injected current still flows into the upper and lower horizontal parts of the active layer 13 resulting in ineffective currents there and confinement of the injected current in the oblique lasing region is difficult, and therefore the external differential quantum efficiency is not sufficiently high. Besides, in order to prevent undesirable parasitic oscillation in the active layer 13 at the other parts than the oblique lasing region 131, the first clad layer 12 should be extremely thin at the parts under the above-mentioned "other parts", but to form the clad layer extremely thin is not easy.

SUMMARY OF THE INVENTION

The present invention provides an improved laser capable of stable fundamental mode lasing at a low threshold current. The laser of the present invention can provide a laser wherein the threshold current monotonously decreases as the width of the current injection region is decreased. Furthermore, the present invention can enable limiting the effective width of the current injection region and the single mode lasing can be retained for a wide range of current.

DESCRIPTION OF THE PREFERRED EMBODIMENTS

A semiconductor laser comprising a terraced-shape semiconductor substrate having a thinner part and a thicker part with a step inbetween, a first clad layer formed on said substrate and having a lower part formed on said thinner part, an upper part formed on said thicker part and a central part formed to connect said lower part and said upper part and having an oblique upper face with respect to the face of said substrate and having a larger thickness than those of the lower part and the upper part, an active layer formed on said first clay layer and having a horizontal lower part formed on said lower part of the first clad layer, a horizontal upper part formed on said upper part of the first clad layer and an oblique central region as a lasing region formed on said central part of said first clad layer and connecting said horizontal lower part and said horizontal upper part therewith with a lower bending and an upper bending inbetween, and a second clad layer formed on said active layer, the improvement is that a current injection region of a stripe-shaped pattern is formed penetrating said second clad layer to contact the latter at the part above said oblique central region of the active layer forming an ohmic junction with a width which is smaller than a width of said oblique central region.

Figure 4:
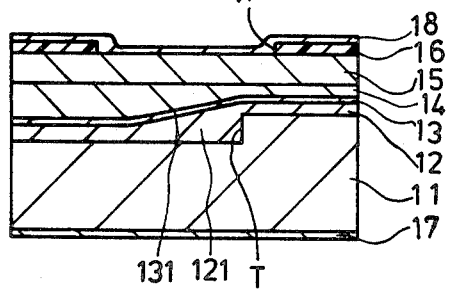
FIG. 4 is a sectional elevation view of a semiconductor laser embodying the present invention.
Figure 5:
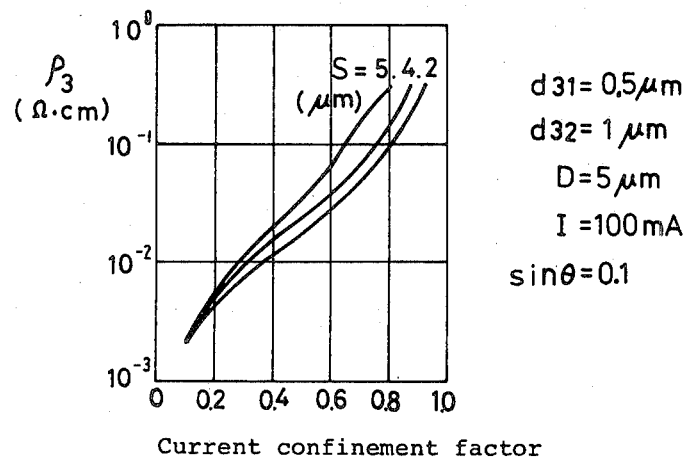
FIG. 5 and FIG. 6 are graphs showing the relation between current confinement rate and specific resistance of the active layer obtained through calculations.
Figure 6:
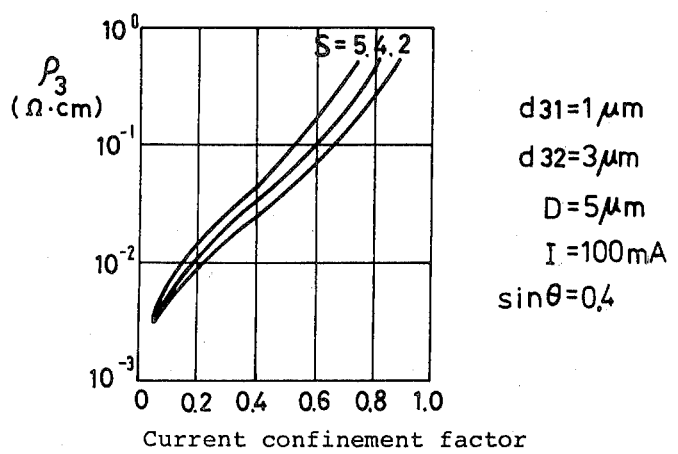

Preferred examples of the present invention are elucidated hereinafter referring to FIG. 4 and thereafter. FIG. 4 elucidates the principle of the present invention, wherein the width S of the contacting region E of the current injection region is smaller than the width D of the oblique central region 131 of the active layer 13. The inventors studied concerning current confinement factor of the lasing region, i.e., the oblique central region of the active layer of the terraced-substrate type semiconductor laser, and found that insufficient exterior differential quantum efficiency and high threshold current are caused by lowness of current confinement factor in the oblique central region, as a lasing region, of the active layer. Then, the inventors made many calculative and empirical studies on the samples as shown in FIG. 4, wherein $\rho_1$, $\rho_2$, and $\rho_3$ are specific resistivities of the first clad layer 12, the active layer 13 and the second clad layer 14, and $d_{31}$ and $d_{32}$ are thickness of the second clad layer 14 at its thicker part which is above the horizontal lower part of the active layer 13 and at its thinner part which is above the horizontal upper part of the active layer 13, respectively, $\theta$ is the angle of the oblique central region 13 against the horizontal plane of the horizontal lower part of the active layer 13. A result of the calculation of this sample is shown in FIGS. 5 and 6, wherein abscissas are graduated with current confinement factor, which is a ratio of a current injected into the oblique central region 131 and the total current injected from the contacting region E of the current injection region, and the ordinates are graduated with the specific resistivity $\rho_3$ of the second clad layer 14, and the parameter of the curves are width S (in $\mu$m) of the contacting region E. As is obvious from the curves of FIGS. 5 and 6, for the specific resistivity $\rho_3$ of $10^{-2}\Omega.cm$ or higher, the current confinement factor is much improved, and especially for the $\rho_3$ of $10^{-1}\Omega.cm$, the factor becomes so high as 50-80%. The upper limit $\rho_3$ is determined by manufacturing factors, and a reasonable upper limit of $\rho_3$ may be $1\Omega.cm$. Summarizing the above, the specific resistivity $\rho_3$ of the second clad layer 14 effects the way of current spreading, that is the current confinement factor can be improved much by controlling the $\rho_3$ value. Also, when the width S is shorter than the $D \cdot \cos \theta$, the current confinement factor becomes large. That is, by controlling the $\rho_3$ value to be larger than $10^{-2}\Omega.cm$ or S value to be smaller than $D \cdot \cos \theta$, through the improvement of the current confinement factor, and hence the threshold current can be made small, and the external differential $\eta_{ext}$ can be improved.

Figure 7:
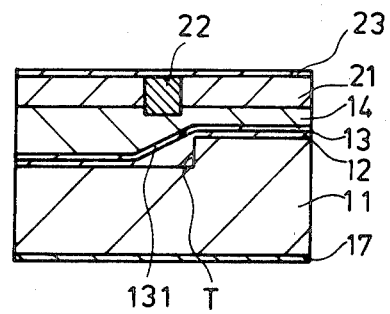
FIG. 7(A), FIG. 7(B) and FIG. 7(C) are sectional elevation views showing various examples embodying the present invention.
Figure 7:
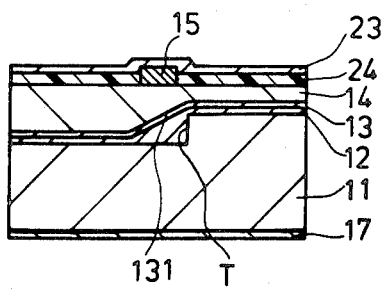
Figure 7:
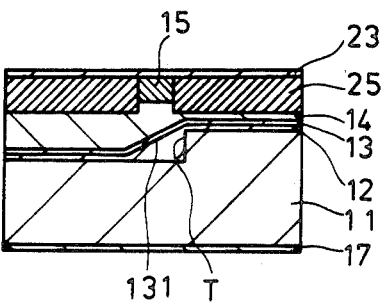

Several embodiments shown by FIG. 7(A), FIG. 7(B) and FIG. 7(C) are proposed as the lasers embodying the above finding.

The laser of FIG. 7(A) shows a GaAs/GaAlAs laser having, on a p-GaAlAs second clay layer 14, a cap layer 21 of n-GaAs, wherethrough a Zn different p-type current region 22 of 3 μm is formed in a manner that its diffusion front slightly goes down into the underlying second clad layer 14. A p-side electrode 23 is formed on the cap layer 23 forming the ohmic contact to the current injection region 22. The cap layer 21 of n-GaAs and the underlying second clad layer 14 of p-GaAlAs form an isolation junction inbetween except the part of the current injection region 22.

FIG. 7(B) shows another GaAs/GaAlAs laser having, on a p-GaAlAs second clad layer 14, a 3 μm width stripe shaped cap layer 15 of p-GaAs, which is formed stripe shape by a known selective etching by utilizing, for example, an etchant of $H_2O_2:NH_4OH = 20:11$, so that only the 3 μm width region of the cap layer 15 is retained on the second clad layer 14. Exposed parts of surface of the second clad layer 14 are then covered by an insulating film 24 of native oxide film or $SiO_2$ film. And then a p-side electrode 23 is formed to make an ohmic contact to the cap layer 15.

FIG. 7(C) shows still another GaAs/GaAlAs laser having, on a p-GaAlAs second clad layer 14, a 3 μm width stripe shaped cap layer 15 of p-GaAs, and the exposed surfaces of the second clad layer 14 are mesa-etched to the midway depth thereof, and a high resistivity GaAs layer 25 is formed on the mesa-etched parts by means of a known vapor phase expitaxial growth from thermally decomposed gas.

Figure 1:
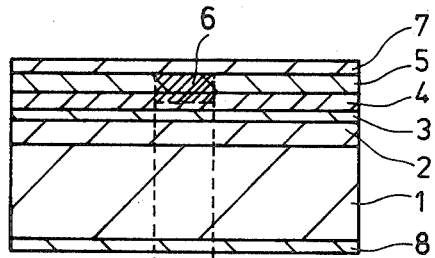
FIG. 1 is a sectional elevation view of the example of conventional planar type semiconductor laser.
Figure 2:
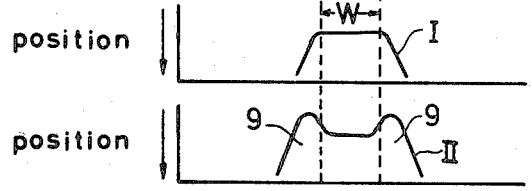
FIG. 2 is a sectional elevational view of the example of another type of conventional semiconductor laser.
Figure 3:
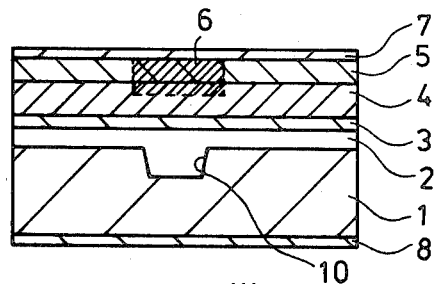
FIG. 3 is a sectional elevational view of the example of conventional terraced substrate type laser.
Figure 8:
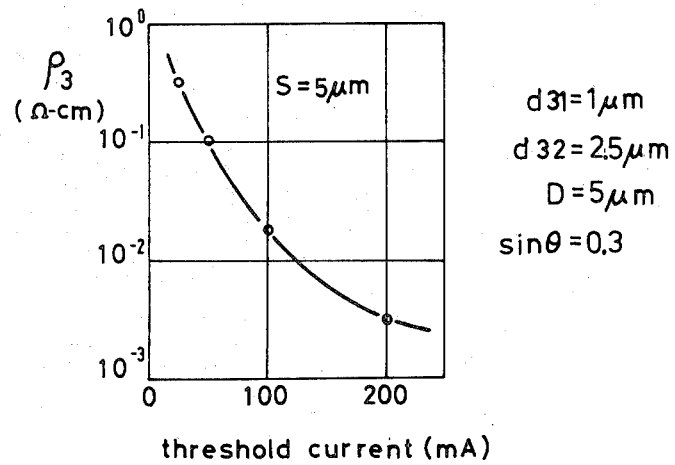
FIG. 8 and FIG. 9 are graphs showing empirical characteristics of the laser of FIG. 7(C).
Figure 9:
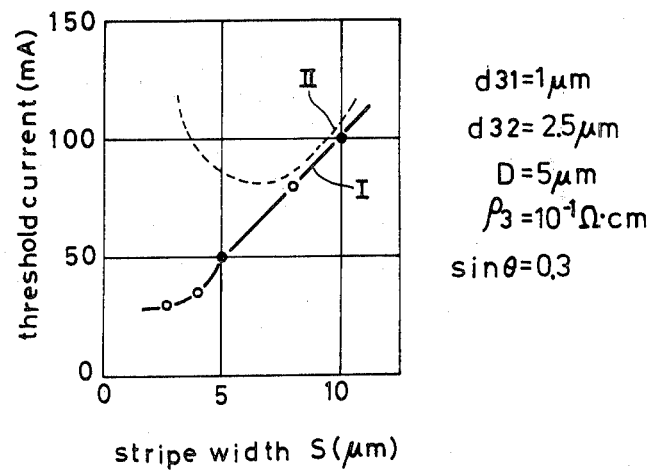

Empirical examinations show that the example of FIG. 7(C) has the smallest threshold value. FIGS. 8 and 9 show empirically obtained characteristics of threshold current with respect to the $\rho_3$ value and S value of the laser of FIG. 7(C). These graphs show coincidence of the characterisitcs with those obtained by the calculation. That is, $\rho_3$ (the specific resistivity of the second clad layer 14) being more than $10^{-2} \Omega \cdot cm$, and S (the width of the oblique central part 131 of the effective current injection region) being smaller than D·cos θ (width in plan view of the oblique central region 131 of the active layer 13) are very effective in reducing the threshold current. Especially as seen in FIG. 9, an important fact is found that the threshold current becomes smaller as the stripe width S becomes narrower, even for the range of the stripe width narrower than 7 μm as shown by curve I, in contradistinction to the characteristic curve I of the conventional planar stripe lasers as shown in FIG. 1 and FIG. 2 wherein the threshold current increases as the stripe width S becomes smaller than 7 μm.

The reason that the threshold current monotonously decreases as the effective width of the current injection region decreases even under 7 μm for the case of the terraced substrate type laser unlike the conventional planar stripe type laser is, supposed that the bendings on both sides of the oblique central region 131 of the terraced substrate type laser confines light in the oblique central region 131 thereby limiting the lasing region to the oblique central region and hence condensing the light for efficient lasing. That is, the currents spreading outside the bendings forms substantially ineffective currents, reducing of which hence effectively decreases the redundant ineffective current. In contrast to the abovementioned terraced substrate type laser, the conventional planar stripe laser has no means to confine the light within a region of a certain width, and therefore, the light is not efficiently condensed to an effective density. Accordingly, as the width of the current injection region becomes narrower than 7 μm and hence the current spreads more radially, then the density of the light decreases thereby increasing the threshold current.

Figure 10A:
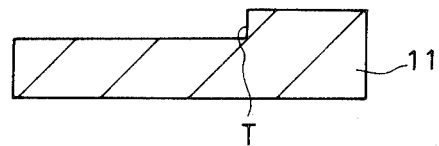
FIG. 10(a), FIG. 10(b), FIG. 10(c) and FIG. 10(d) are sectional elevation views showing manufacturing steps of the laser of FIG. 7(C).
Figure 10B:
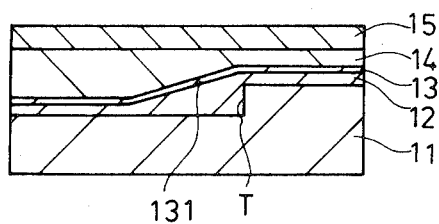
Figure 10C:
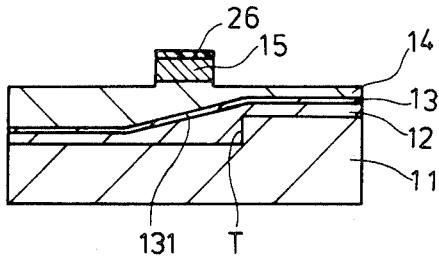
Figure 10D:
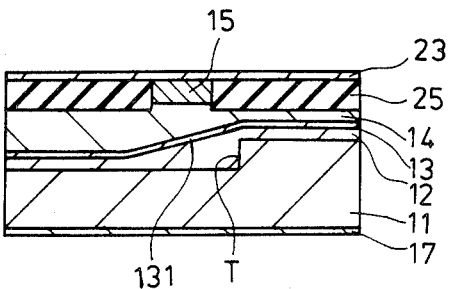

FIG. 10(a), FIG. 10(b), FIG. 10(c) and FIG 10(d) show steps of manufacturing the laser of FIG. 7(C). On a substrate as shown in FIG. 10(a), i.e., a terraced substrate 11 of . . . n-GaAs having about 1.5 μm high terrace step T, the following layers are formed by a sequential liquid phase epitaxial growth:
a first clad layer 12 of . . . n-$Ga_{0.7}Al_{0.3}As$,
an active layer 13 of . . . n-$Ga_{0.95}Al_{0.05}As$,
a second clad layer 14 of . . . p-$Ga_{0.7}Al_{0.3}As$,
a cap layer 15 of . . . p-GaAs, as shown by FIG. 10(b). The first clad layer 12 is about 0.3 μm thick at its thinner part and is about 1 μm at its thicker part, so that the light oscillated in the active layer 13 is not absorbed into the substrate 11. The oblique central region, i.e., the lasing region is about 3 μm wide. The second clad layer 14 is about 1 μm thick at its thinner part and about 2.5 μm thick at its thicker part, so that upper face thereof becomes flat. The cap layer 15 is about 1.5 μm thick. After the completion of the epitaxial growth, an $SiO_2$ film 26 of 5000Å thickness is formed. And by means of a known photoetching method, the $SiO_2$ film 26 is etched to retain only at the part of a 3 μm width stripe-shaped part at the position above the oblique central region 131. Then by utilizing the 3 μm width $SiO_2$ film 26 as the etching mask the cap layer 15 of p-GaAs is etched and further the second clad layer 14 of p-$G_{0.7}Al_{0.3}As$ is also etched to its midway depth as shown by FIG. 10(c). Thus a current injection region of 3 μm width is provided on the second clad layer 14. Then, by means of thermal decomposition gas phase growth method, high resistance GaAs layer 25 is formed to fill the etched away recess spaces on the second clad layer 14, in a manner that the upper faces thereof become flush with the top face of the retained stripe shaped p-GaAs cap layer 25. After removing the $SiO_2$ mask 26 a known p-side electrode 23 is formed on the top face. After etching the bottom face of the substrate 11 in a manner that the overall thickness of the wafer becomes about 100 μm, known n-side electrode 17 is formed, and the laser element is completed as shown in FIG. 10(d).

The abovementioned condition that $$\rho_3 > 10^{-2} \Omega \cdot cm$$

is applicable not only to any type of lasers which have a substrate of non-flat principal face.

In actual mass production of laser, it is not very easy to form the current injection region of such a narrow width as 3 μm. Therefore, the belowmentioned example is described by which one can easily obtain such narrow effective width of the current injection region as 2-3 μm.

Figure 11A:
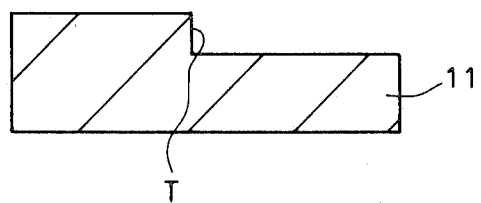
FIG. 11(a), FIG. 11(b) and FIG. 11(c) are sectional elevation views showing manufacturing steps of a laser of another example.
Figure 11B:
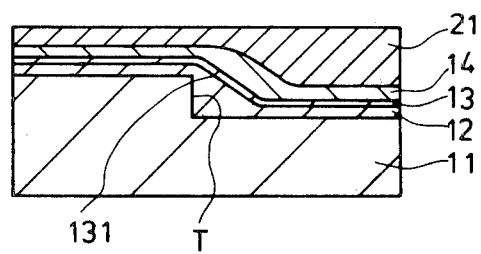
Figure 11C:
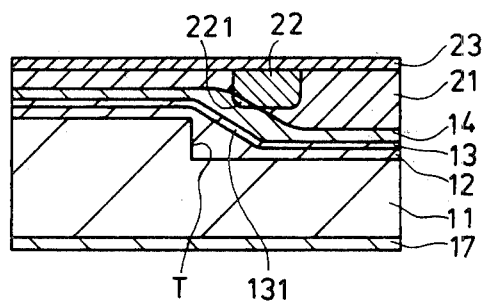

FIG. 11(a) to FIG. 11(c) show manufacturing steps of an example of such laser, wherein as shown in FIG. 11(c), a diffused current injection region 22 contacts the second clad layer 14 of the same conductivity type with its one lower corner, thereby defining an effectively narrow current injection region. Hereinafter the same numerals designate the layers or regions of similar natures.

The manufacturing is as follows:

A terraced-shape semiconductor substrate is formed to have a step T, and on its surface, a first clad layer 12 of n-GaAlAs is formed by liquid phase epitaxial growth method, in a manner that at the parts above the thinner and thicker horizontal parts of the substrate 11 the first clad layer 12 is thin such as to allow absorption of evanescent light from the overriding active layer 13 to the substrate 11, and that at the part above the foot of the step part T the first clad layer 12 is thick such as to prevent the absorption of evanescent light from the active layer 13 to the substrate 11 therethrough. Subsequently, the active layer 13 is epitaxially grown on the first clad layer 12, so that the the active layer 13 has the oblique central region 131 defined between an upper bending and the lower bending, and that the oblique central region 131 is thicker than horizontal parts of the active layer 13. Further subsequently, the second clad layer 14 of p-GaAlAs is epitaxially grown, in a manner to be thinner at the horizontal parts and thicker at the oblique part which is above the oblique central region 131 thereby to prevent absorption of evanescent light from the lasing region 131 of the active layer 13 to the overriding cap layer 21. The cap layer 21 of n-GaAs is epitaxially grown in a manner to be thicker on the lower horizontal part of the active layer 13 and thinner on the higher horizontal part of the active layer 13, thereby having a p-n isolation junction with two bendings between the active layer 14 and the cup layer 21, as shown in FIG. 11(b). Then, as acceptor such as Zn is selectively diffused in the stripe shaped pattern from the surface of the cap layer 21 to form a current injection region 22 of p-type conductivity. The position and depth of the diffusion are controlled in a manner that a corner edge 221 of the diffused region 22 which is near the oblique central region 131 penetrates the cap layer 21 and intrudes into the second clad layer 14 at the part around above the center line of the oblique central region 131, thereby forming an ohmic junction of a narrowly controlled width above the center line of the lasing region 131. The width of the ohmic junction between the regions 22 and 14 can be easily controlled smaller than the width of the diffused region 22 by controlling the position and depth of the diffused region 22. The diffusion of the region 22 should be stopped so as to retain the other corner edge of the diffused region 22 in the cap layer 21. Then, p-side electrode 23 and n-side electrode 17 are formed on the upper and lower face of the wafer as shown by FIG. 11(c).

Manufacturing of the GaAs/Ga$_{1-x}$Al$_x$As laser elucidated referring to FIG. 11(a) to FIG. 11(c) is explained more in detail in the following. A step of 1.5 μm height in <011> direction is formed on the (100) face of an n-GaAs substrate 11 by known photolithographic technique to utilize an etchant containing sulfuric acid. Then by means of a liquid phase epitaxial growth method, a first clad layer 12 of n-Ga$_{0.7}$Al$_{0.3}$As is formed, in a manner that at the parts above the thinner and thicker horizontal parts of the substrate 11 the first clad layer 12 is about 0.2 μm so as to allow absorption of evanescent light from the overriding active layer 13 to the substrate 11, and that at the part above the foot of the step part T the first clad layer 12 is formed about 1 μm so as to prevent the absorption of evanescent light from the active layer 13 to the substrate 11 therethrough. Such thickness can be obtainable as a result that growth rate is higher at the step part. Subsequently, the active layer 13 of non-doped Ga$_{0.95}$Al$_{0.05}$As is epitaxially grown on the first clad layer 12, so that the active layer 13 has the oblique central region 131 defined between an upper bending and the lower bending, and that the oblique central region 131 is of about 0.1 μm thickness which is thicker than horizontal parts of the active layer 13 of about 0.08 μm thickness. Further subsequently, the second clad layer 14 of p-Ga$_{0.65}$Al$_{0.35}$As is epitaxially grown, in a manner to be about 0.4 μm thick at the horizontal parts and about 1.5 μm thick at the oblique part which is above the oblique central region 131 thereby to prevent absorption of evanescent light from the lasing region 131 of the active layer 13 to the overriding cap layer 21. Subsequently the cap layer 21 of n-GaAs is epitaxially grown in a manner to be about 2.5 μm on the lower horizontal part of the active layer 13 and about 1 μm on the higher horizontal part of the active layer 13, thereby having a p-n isolation junction with two bendings between the clad layer 14 and the cap layer 21, as shown in FIG. 11(b). In case of liquid phase epitaxial growth from nearly saturated Ga solution, the difference of the growth speed between that on the horizontal face and on the step face is very large, and therefore the upper face of the second clad layer 21 becomes almost flat and horizontal all over the wafer. Then a diffusion mask of Si$_3$N$_4$ (not shown in the drawing) is formed over the cap layer 21 and a 3 μm width stripe-shaped opening is formed in a position where the center line of the stripe-shaped opening is off from the center line of the stripe-shaped oblique central region 131 by 2 μm rightwards (i.e. in the direction from the position of the step to the lower part). Then, from this opening of the mask, an acceptor such as Zn is selectively diffused in the stripe-shaped pattern from the surface of the cap layer 21 to form a current injection region 22 of p-type conductivity. The depth of the diffusion is so controlled that the corner edge 221 of the diffused region 22 which is near the oblique central region 131 penetrates the cap layer 21 and intrudes into the second clad layer 14 at the part around above the center line of the oblique central region 131, thereby to form an ohmic junction between the layer 14 and region 22. The condition of the diffusion is 750° C. for 20 minutes so as to attain diffusion depth of 2.5 μm thereby to form the diffused region as shown by FIG. 11(c). Since the second clad layer 14 has an oblique face at the part above the lasing region 131 and the diffusion front of the diffused region 22 goes down vertically, the width of the ohmic junction can be easily controlled as narow as 3 μm or narrower by controlling the diffusion depth. Then, after removing the Si$_3$N$_4$ mask, the p-side electrode 23 is formed by sequential sputtering of Ti, Pt and Au. Thereafter, the bottom face of the substrate 11 is chemically etched so that the overall thickness of the wafer becomes 100 μm, and an n-side ohmic electrode 17 is formed by vapor deposition of Au-Ge-Ni followed by alloying treatment, as shown by FIG. 11(c). Then the laser wafer is divided into unit laser by cleaving to form laser elements having a cavity length L of 250 μm and wafer width of 250 μm, and each element is mounted on a copper block.

The laser manufactured by the abovementioned process can lase at such a low threshold current as 40 mA in the room temperature continuous wave oscillation and attains such high external differential quantum efficiency ($\eta_{ext}$) of about 35%. The laser of FIG. 11(c) has the following advantageous features:

When a forward voltage is impressed across the positive electrode 23 and the negative electrode 17, a reverse bias voltage is impressed to the p-n junction between the n-type cap layer 21 and the p-type second clad layer 14, and accordingly the injected current concentrates only to the diffused region 22 and flows through the narrow 3 μm width ohmic junction part 221 between the region 22 and the region 14. That is, the current injection region 221 is very narrow in its width and very close to the lasing region 131 facing the central line of the latter. Therefore, the injected current necessarily concentrate in the central part of the lasing region 131, and thereby decreasing threshold current of lasing, and raising external differential quantum efficiency $\eta_{ext}$, and furthermore, parasitic oscillation due to spread current is suppressed.

Next, since the second clad layer 14 has the thicker part only on the oblique central region, i.e., the lasing region 131, the adjacent part to the thicker part of the layer 14 is formed thin, therefore transverse spreading of the injected current to the thin adjacent part is efficiently suppressed and injected substantially only to the lasing region 131.

The light oscillated in the lasing region 131 is sufficiently confined therein by means of both thick parts of the clad layers 12 and 14 disposed on both sides of the lasing region 131, and by two bendings of the active layer 13, thereby assuring very efficient single mode oscillation.

The concentration of injected current to the central line part of the lasing region 131 and the good confinement of the light in the lasing region 131 result in drastic reduction of threshold current and $\eta_{ext}$. FIG. 11(d) to FIG. 11(h) show various characteristics of the laser of FIG. 11(c) having the cavity length L=250 μm. In FIG. 11(d), small circles show experimental values of wavelength-threshold current characteristics at room temperature continuous wave lasing, and the broken line curve shows an inverse of internal quantum efficiency $\eta_{int}$ obtained by a calculation providing the threshold current of 20 mA for the oscillation wavelength of 850 nm, and both the experimental values and the calculated curve show good agreement. It is supposed that the increase of the threshold current in the short wavelength region should be due to decreasing of the $\eta_{int}$. However, by means of good confinement of current in the lasing region, the threshold current is such a low value even for the visible light as follows:
30-50 mA . . . at λ=730 nm and
90 mA . . . at λ=710 nm.

FIG. 11(e) shows light output-current characteristic of the laser for the lasing wavelengths of λ=830 nm and λ=725 nm, and their far field image of the light. The laser of λ=830 nm has the fundamental mode oscillation up to the current twice that of threshold current. The maximum output (to break the end face) of this laser was 30 mW in case without and protection film, and 50 mW with the end protection film. It was confirmed that when the laser was oscillating in fundamental transverse mode, the oscillation spectrum was a single axial mode.

Figure 11:
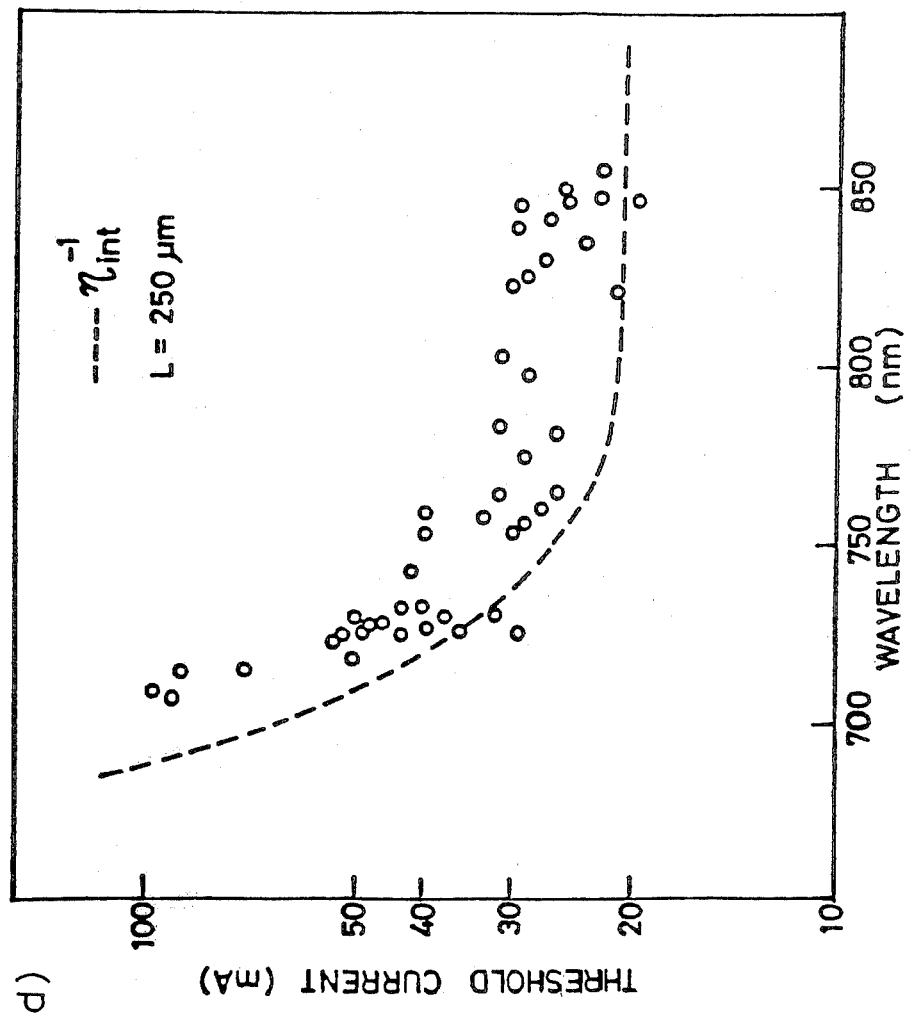
FIG. 11(d), FIG. 11(e), FIG. 11(f), FIG. 11(g) and FIG. 11(h) are graphs showing various characteristics of the laser of FIG. 11(c).
Figure 11:
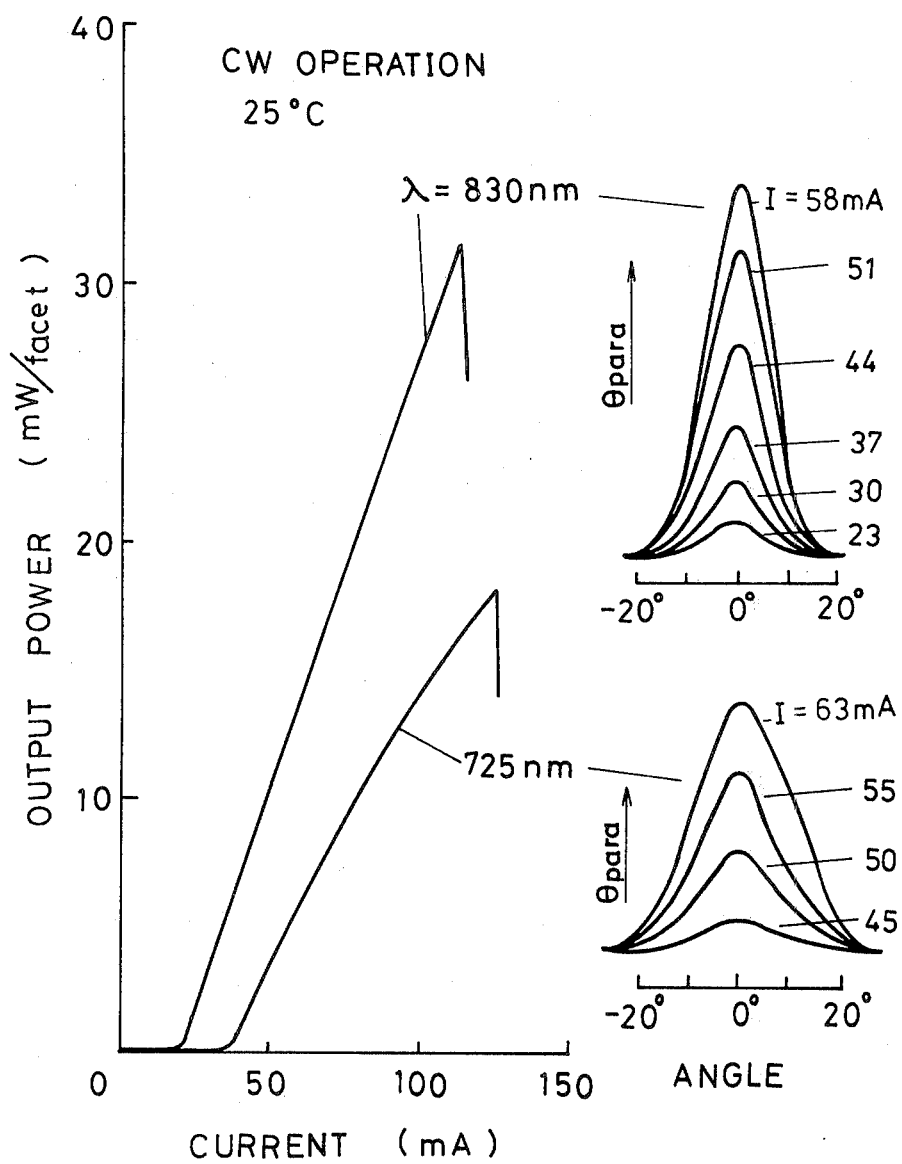
Figure 11F:
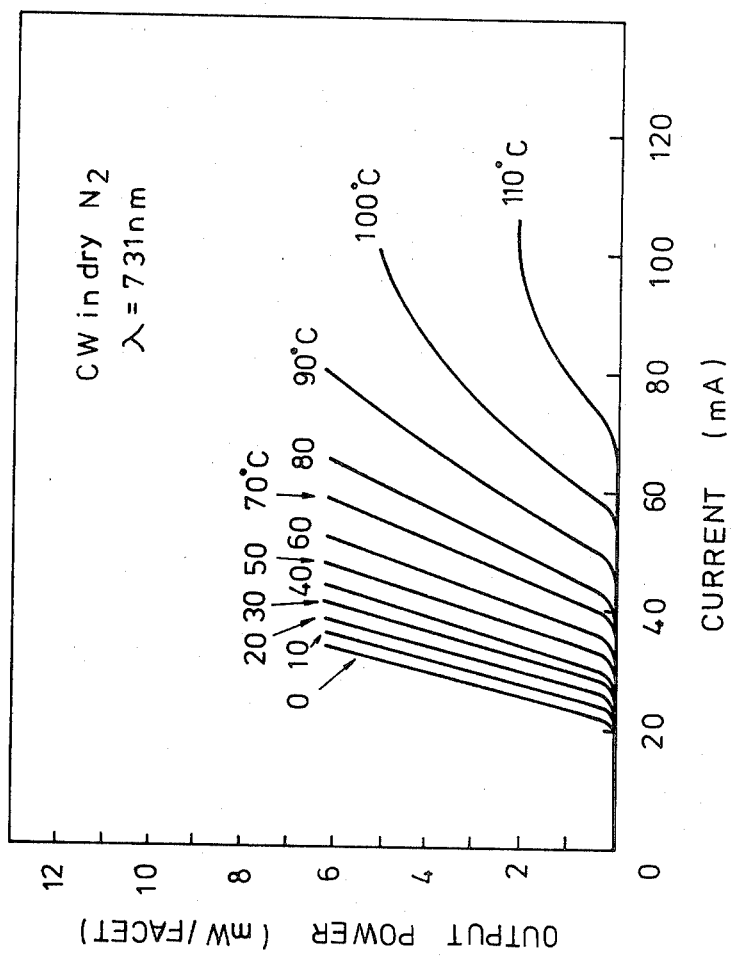

FIG. 11(f) shows light output-current characteristics of the laser of λ=731 nm for variations of ambient temperature. Maximum temperature wherein continuous oscillation is possible becomes low as the wavelength is shorter, as follows:
150° C. . . . for the laser of 830 nm, and
110° C. . . . for the laser of 730 nm.

Figure 11G:
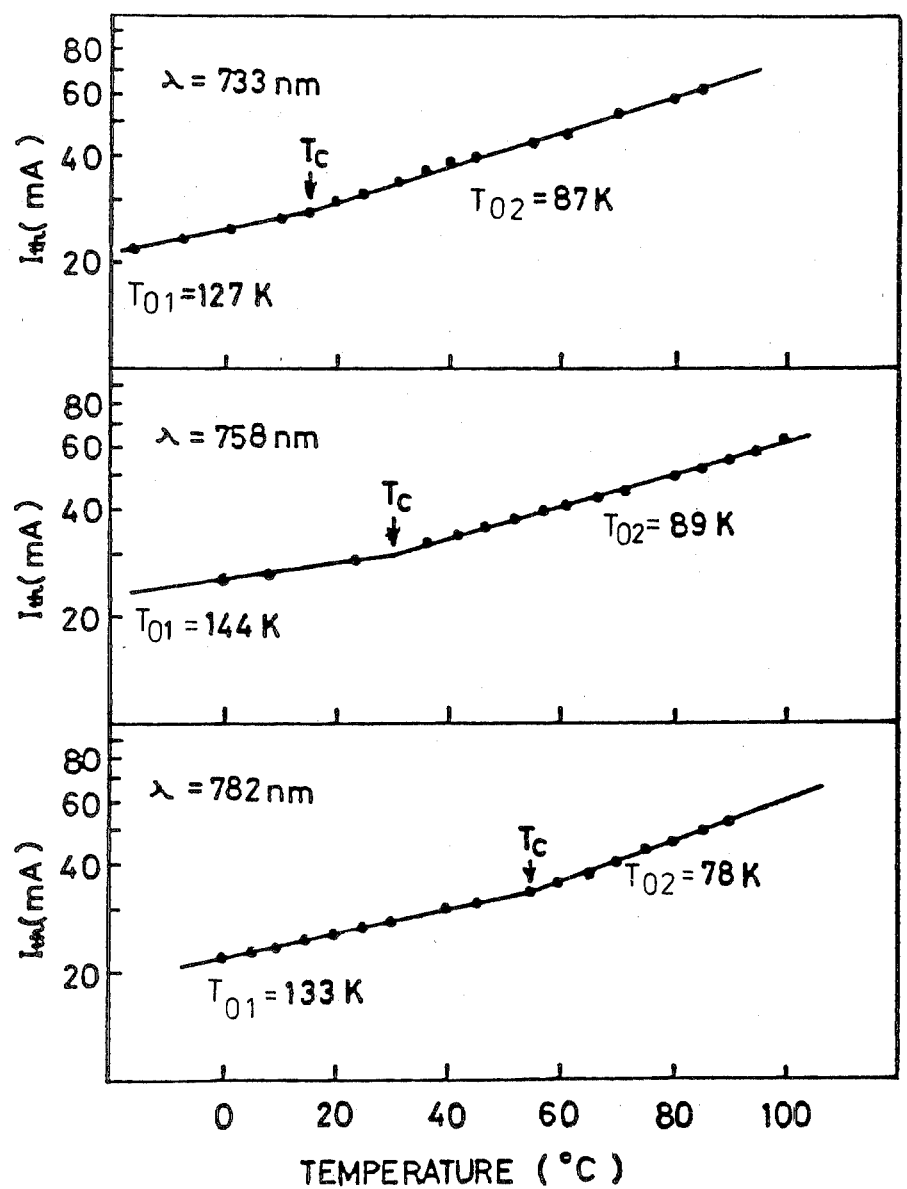

FIG. 11 (g) shows temperature dependence of the threshold current $I_{th}$ for the lasers of 733 nm, 758 nm and 782 nm. In FIG. 11(g), the figures of $T_{01}$ and $T_{02}$ are obtained in a formula of:

$$I_{th}\alpha\exp(T/T_{0i})$$

Every laser shown by FIG. 11(g) has higher characteristic temperatures $T_{01}$ and lower characteristic temperatures $T_{02}$ bounded by critical temperatures $T_c$.

FIG. 11(g) shows lifetime characteristics of the laser of FIG. 11(c), measured in 25° C. $N_2$ atmosphere, operating to output 4 mW continuous wave by means of an automatic power control system. The end faces of the laser are not coated. As shown by the curves, the lifetimes are shorter as the oscillation wavelength is shorter, and for the wavelength of λ=726 nm the lifetime is about 150 hrs. As a result of high temperature accelerated lifetest, the lifetime of this laser can be expected to be longer than $2\times10^5$ hours for infrared wavelength oscillation, and also a similar lifetime can be expected for the oscillation of 760 nm or longer wavelength.

Figure 12:
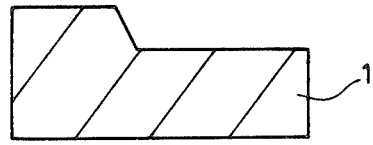
FIG. 12(a), FIG. 12(b), FIG. 12(c) and FIG. 12(d) are sectional elevation views showing manufacturing steps of still another example.
Figure 12:
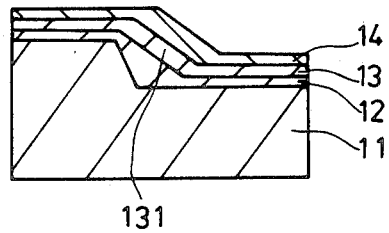
Figure 12:
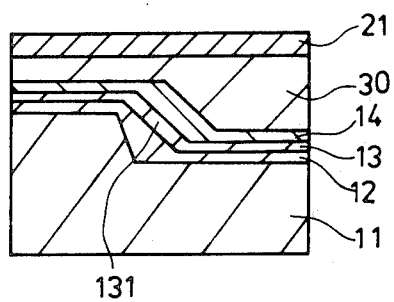
Figure 12:
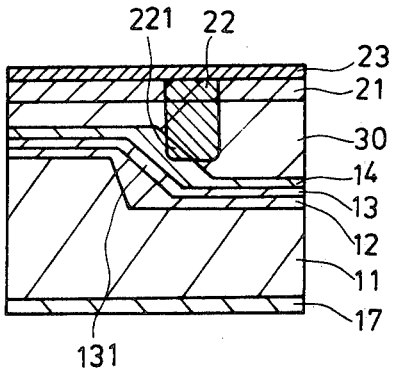

FIG. 12(a), FIG. 12(b), FIG. 12(c) and FIG. 12(d) show steps of manufacturing the laser of still another example capable of good current confining. This laser adopts an additional layer 30 of n-$Ga_{1-z}Al_zAs$ which can effectively confine the light therein between a second clad layer 14 of $Ga_{1-x}Al_xAs$ and a cap layer 21 of n-GaAs. On a substrate as shown in FIG. 12(a), i.e.,
a terraced substrate 11 of . . . n-GaAs having about 1.5 μm high terrace step T, the following layers are formed by a sequential liquid phase epitaxial growth:
a first clad layer 12 of . . . n-$Ga_{1-x}Al_xAs$,
an active layer 13 of . . . n-$Ga_{1-y}Al_yAs$,
a second clad layer 14 of . . . p-$Ga_{1-x}Al_xAs$,
a third clad layer 30 of . . . n-$Ga_{1-z}Al_zAs$,
a cap layer 21 of . . . p-GaAs.

The terraced-shape semiconductor substrate is formed to have a step T, and on its surface, the first clad layer 12 of n-GaAlAs is formed by liquid phase epitaxial growth method, in a manner that at the parts above the thinner and thicker horizontal parts of the substrate 11 the first clad layer 12 is formed about 0.3 μm so as to allow absorption of evanescent light from the overriding active layer 13 to the substrate 11, and that at the part above the foot of the step part T the first clad layer 12 formed about 1 μm so as to prevent the absorption of evanescent light from the active layer 13 to the substrate 11 therethrough. Such thickness can be obtainable as a result that growth rate is higher at the step part. Subsequently, the active layer 13 of non-doped $Ga_{0.95}Al_{0.05}As$ is epitaxially grown on the first clad layer 12, so that the active layer 13 has the oblique central part 131 defined between an upper bending and the lower bending, and that the oblique central region 131 is of about 0.1 μm thickness which is thicker than horizontal parts of the active layer 13 of about 0.08 μm thickness. Further subsequently, the second clad layer 14 of p-$Ga_{0.65}Al_{0.35}As$ is epitaxially grown as shown by FIG. 12(b), in a manner to be about 0.4 μm thick at the horizontal parts and about 1.5 μm thick at the oblique part which is above the oblique central region 131 thereby to prevent absorption of evanescent light from the lasing region 131 of the active layer 13 to the overriding layers. Then the third clad layer 30 and the cap layer 21 are formed by sequential liquid phase epitaxial growth from nearly saturated Ga solutions as shown by FIG. 12(c). The clad layers 14 and 30 are of opposite conductivity type to each other, and have broader energy gaps than that of the active layer 13. One example of the values of x, y and z for infrared lasers are, $x = 0.35$, $y = 0.05$ and $z = 0.35$ or smaller.

As a result of the abovementioned use of the nearly saturated Ga solution, by means of a large difference of the growth speed between that on the horizontal face and on the oblique face near the step part, the third clad layer 30 becomes thicker (about 2.5 μm) on the lower horizontal part of the active layer 13 and thinner (about 1 μm) on the higher horizontal part of the active layer 13, thereby forming a substantially flat and horizontal junction face between the third clad layer 30 and the cap layer 21, as shown in FIG. 12(c). Then a diffusion mask of $SiO_2$ or $Si_3N_4$ (not shown in the drawing) is formed over the second clad layer 21 and a 3 μm width stripe-shaped opening is formed in a position where the center line of the stripe-shaped opening is off from the center line of the stripe-shaped oblique central region 131 by 2 μm rightwards (i.e. in the direction from the position of the step to the lower part). Then, from this opening of the mask, acceptor such as Zn is selectively diffused in the stripe-shaped pattern from the surface of the cap layer 21 to form a current injection region 22 of p-type conductivity. The width of the ohmic junction between the regions 22 and 14 can be easily controlled smaller than the width of the diffused region 22 by controlling the position and depth of the diffused region 22. The diffusion of the region 22 should be stopped so as to retain the other corner edge of the diffused region 22 in the cap layer 21. Then, p-side electrode 23 and n-side electrode 17 are formed on the upper and lower face of the wafer as shown by FIG. 12(d).

In accordance with the structure of this example of FIG. 12(d), by means of the provision of the third clad layer 30 of GaAlAs, which has a smaller light absorption than the cap layer 21 of GaAs, there is no fear that the light is absorbed upwards. Accordingly, the second clad layer 14 can be thin on the lasing region 131. Therefore, because of such thinness of the clad layer 14 on the lasing region 131, the satisfactory confinement of the injected current in the lasing region, or satisfactory suppressing of lateral spreading of the injected current can be attained, thereby enabling highly concentrating the injected current to the lasing region and reducing the threshold current. This laser can oscillate only with 20 mA current and has such high efficiency as issuing light output of 10 mW or more with the injected current of 20 mA to 30 mA. Also, the linearity between the injected current and the light output is good for a wide range, so that 50 mW or more light output is obtainable with the good linearity.

FIG. 13(a), FIG. 13(b), FIG. 13(c) and FIG. 13(d) show steps of manufacturing the laser of still another example having very thin parts at both bendings of the active layer 13 and hence capable of very low threshold current and very small far-field spot characteristic.

Figure 13A:
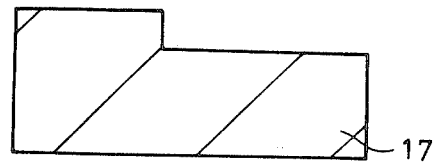
FIG. 13(a), FIG. 13(b), FIG. 13(c) and FIG. 13(d) are sectional elevation views showing manufacturing steps of still another example.
Figure 13B:
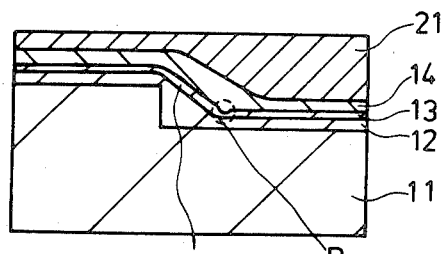

On a substrate as shown in FIG. 13(a), i.e.,
a terraced substrate 11 of ... n-GaAs having about 2 μm high terrace step T, the following layers are formed by a sequential liquid phase epitaxial growth:
a first clad layer 12 of ... n-$Ga_{0.7}Al_{0.3}As$,
an active layer 13 of ... n-$Ga_{0.95}Al_{0.05}As$
a second clad layer 14 of ... p-$Ga_{0.7}Al_{0.3}As$,
a cap layer 15 of ... p-GaAs, as shown by FIG. 13(b).

Figure 13C:
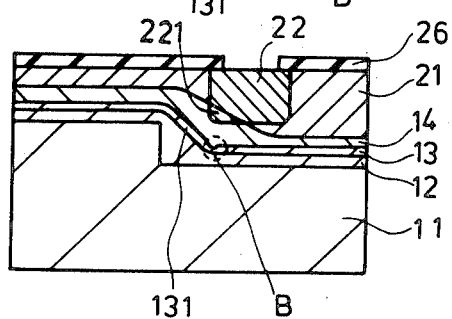
Figure 13D:
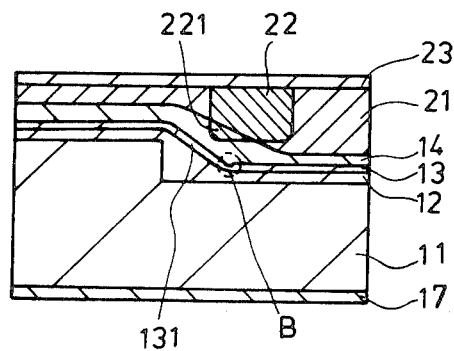

Manufacturing of the GaAs/$Ga_{1-x}Al_xAs$ laser of FIG. 13(a) to FIG. 13(d) is elucidated in detail in the following: A step of 2 μm height in <011> direction is formed on the (100) face of an n-GaAs substrate 11 by known photolithographic technique to utilize an etchant containing sulfuric acid. Then by means of a liquid phase epitaxial growth method, a first clad layer 12 of n-$Ga_{0.7}Al_{0.3}As$ is formed in a manner that, at the parts above the thinner and thicker horizontal parts of the substrate 11, the first clad layer 12 is formed about 1 μm thick. Subsequently, the active layer 13 of non-doped $Ga_{0.95}Al_{0.05}As$ is epitaxially grown on the first clad layer 12, so that the active layer 13 has the oblique central part 131 defined between an upper bending and the lower bending, and that at least the lower bending is thinned to about 0.08 μm thick, so that the bending part is thinner than other parts of the active layer 13. Further subsequently, the second clad layer 14 of p-$Ga_{0.65}Al_{0.35}As$ is epitaxially grown, in a manner to be about 0.4 μm thick at the horizontal parts and about 1.0 μm thick at the oblique part which is on the oblique central region 131. Subsequently the cap layer 21 of n-GaAs is epitaxially grown in a manner to be about 2.5 μm on the lower horizontal part of the active layer 13 and about 1 μm on the higher horizontal part of the active layer 13, thereby forming a flat and horizontal upper face thereof. In case of liquid phase epitaxial growth from nearly saturated Ga solution, difference of the growth speed between that on the horizontal face and on the step face is very large, and therefore the upper face of the second clad layer 21 becomes almost flat and horizontal all over the wafer. Then a diffusion mask of $Si_3N_4$ (not shown in the drawing) is formed over the cap layer 21 and a 3 μm width stripe-shaped opening is formed in a position where the center line of the stripe-shaped opening is off from the center line of the stripe-shaped oblique central region 131 by 2 μm rightwards (i.e. in the direction from the position of the step to the lower part). Then, from this opening of the mask, an acceptor such as Zn is selectively diffused in the stripe-shaped pattern from the surface of the cap layer 21 to form a current injection region 22 of p-type conductivity. The depth of the diffusion is so controlled that the corner edge 221 of the diffused region 22 which is near the oblique central region 131 penetrates the cap layer 21 and intrudes into the second clad layer 14 at the part around above the center line of the oblique central region 131, thereby to form an ohmic junction between the layer 14 and region 22, as shown by FIG. 13(c). Since the second clad layer 14 has an oblique face at the part above the lasing region 131 and the diffusion front of the diffused region 22 goes down vertically, the width of the ohmic junction can be easily controlled as narrow as 3 μm or narrower by controlling the diffusion depth. Then, after removing the $Si_3N_4$ mask, the p-side electrode 23 is formed by sequential sputtering of Ti, Pt and Au. Thereafter, the bottom face of the substrate 11 is chemically etched so that the overall thickness of the wafer becomes 100 μm, and an n-side ohmic electrode 17 is formed by vapor deposition of Au-Ge-Ni followed by alloying treatment, as shown by FIG. 13(d). Then the laser wafer is divided into unit laser by cleaving to form laser elements having a cavity length L of 250 μm and wafer width of 250 μm, and each element is mounted on a copper block.

The laser manufactured by the abovementioned process can lase at such a low threshold current Ith of 30 mA to 40 mA in the room temperature continuous wave oscillation and attains such high external differential quantum efficiency ($\eta$ext) of about 40%. The laser of FIG. 13(d) has the following advantageous features:

When a forward voltage is impressed across the positive electrode 23 and the negative electrode 17, an reverse bias voltage is impressed to the p-n junction between the n-type cap layer 21 and the p-type second clad layer 14, and accordingly the injected current concentrates only to the diffused region 22 and flows through the narrow 3 μm width ohmic junction part 221 between the region 22 and the region 14. That is, the current injection region 221 is very narrow in its width and very close to the lasing region 131 facing the central line of the latter. Furthermore, at the lower end of the lasing the injected current necessarily concentrates in the central part of the lasing region 131 and the light is sufficiently confined in the lasing region 131. And therefore, by the interaction of the improvements of both the current concentration and the light confinement, the threshold current of lasing is drastically decreased, and the external differential quantum efficiency $\eta$ext is also much improved, and furthermore, parasitic oscillation due to spread current is suppressed.

Figure 14:
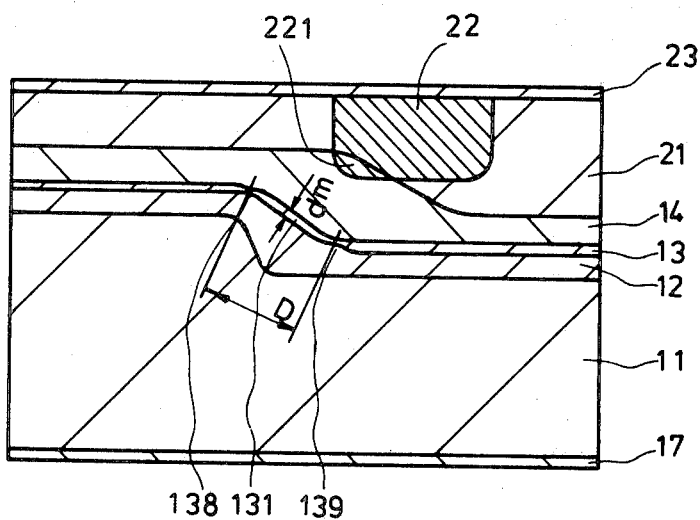
FIG. 14 is a sectional elevation view of still another example.

FIG. 14 shows still another example having a lasing region of lens-like section, and thereby has a very high external differential quantum efficiency. The structure is: on a terraced substrate 11 of ... n-GaAs having 1.5 to 2.0 μm high the terrace step T, the following layers are formed by a sequential liquid phase epitaxial growth:
a first clad layer 12 of ... n-Ga$_{0.7}$Al$_{0.3}$As.
an active layer 13 of ... n-Ga$_{0.95}$Al$_{0.05}$As,
a second clad layer 14 of ... p-Ga$_{0.7}$Al$_{0.3}$As,
a cap layer 15 of ... p-GaAs,
as shown by FIG. 14. Manufacturing of the GaAs/Ga$_{1-x}$Al$_x$As laser in detail in the following. A step of 1.5 to 2.0 μm height in <011> direction is formed on the (100) face of an n-GaAs substrate 11 by known photolithographic technique to utilize an etchant containing sulfuric acid. Then by means of a liquid phase epitaxial growth method, a first clad layer 12 of n-Ga$_{0.7}$Al$_{0.3}$As is formed, in a manner that at the parts above the thinner and thicker horizontal parts of the substrate 11 the first clad layer 12 is about 0.4 μm thick and that, at the part above the foot of the step part T, the first clad layer 12 is about 1 μm thick. The epitaxial growth of the first clad layer 21 is started at 845° C., the cooling rate is 0.3° C./minute and the growth of the first clad layer 21 is stopped at the temperature of 843° C., so that the 1 μm thickness is obtained on the foot of the step part T.

Subsequently, the active layer 13 of non-doped Ga$_{0.95}$Al$_{0.05}$As is epitaxially grown on the first clad layer 12, so that the layer has the oblique central region 131 defined between an upper bending and the lower bending, and that the oblique central region 131 defined between an upper bending and the lower bending, and that the oblique central region 131 is shaped to have a convex lens-like section defined between a very thin upper bending 138 and a very thin lower bending 139. Such sectional shape is obtained by controlling the supercooling temperature to be 6°–8° C. and the growth time to be for 0.6 sec. Preferable width D and maximum thickness dm of the lasing region 131 depends on the difference of refractice indexes of the active layer 13 and the clad layers 12 and 14; in this example, D≈3.5 μm and dm=0.1 μm. Further subsequently, the second clad layer 14 of p-Ga$_{0.65}$Al$_{0.35}$As is epitaxially grown, in a manner to be about 0.4 μm thick at the horizontal parts and about 1.5 μm thick at the oblique part which is on the oblique central region 131. The second clad layer is formed so as to have a thick part on the lasing region 131, by growing from a nearly saturated Ga-solution. Subsequently the cap layer 21 of n-GaAs is epitaxially grown in a manner to be about 2.5 μm on the lower horizontal part of the active layer 13 and about 1 μm on the higher horizontal part of the active layer 13, thereby having a flat and horizontal upper face as shown in FIG. 14. Such forming of different thickness is also attained by the growth from the nearly saturated Ga-solution. Then, by use of a known mask of SiO$_2$ or Si$_3$N$_4$ an acceptor such as Zn is selectively diffused in a 3 μm width stripe-shaped pattern from the surface of the cap layer 21 to form a current injection region 22 of p-type conductivity.

Then, after removing the Si$_3$N$_4$ mask the p-side electrode 23 is formed by sequential sputtering of Ti, Pt and Au. Thereafter, the bottom face of the substrate 11 is chemically etched so that the overall thickness of the wafer becomes 100 μm, and an n-side ohmic electrode 17 is formed by vapor deposition of Au-Ge-Ni followed by alloying treatment.

The laser munufactured by the abovementioned process is very much improved of the threshold current and external differential quantum efficiency, and lasing at a fundamental transverse mode is obtainable up to such a large current as 3 times large as the threshold current. The example laser with the cavity length L=250 μm can lase at such a low threshold current as 25 mA in room temperature continuous wave oscillation and attains such high external differential quantum efficiency ($\eta$ext) of about 40%. In this laser of FIG. 14, distribution of the effective refractive index is formed in a parabolic distribution having the peak at the centre of the lasing region 131, and therefore a large width D can be adopted thereby not only making the process easy but also advantageous in cutting off higher modes of oscillation.

Figure 15:
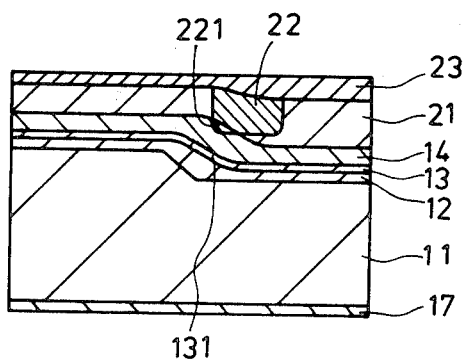
FIG. 15 is a sectional elevation view of still another example.

FIG. 15 shows still another example having a lasing region 131, which has smooth bendings on both side parts of the lasing region 131. The structure is: on
a terraced substrate 11 of ... n-GaAs having about 2 μm high terrace step T, the following layers are formed by a sequential liquid phase epitaxial growth:
a first clad layer 12 of ... n-Ga$_{0.7}$Al$_{0.3}$As
an active layer 13 of ... n-Ga$_{0.95}$Al$_{0.05}$As,
a second clad layer 14 of ... p-Ga$_{0.7}$Al$_{0.3}$As,
a cap layer 15 of ... p-GaAs,
as shown by FIG. 15. Manufacturing of the GaAs/Ga$_{1-x}$Al$_x$As laser of FIG. 15 is elucidated in detail in the following. A step of 1.5 μm height in <011> direction is formed on the (100) face of an n-GaAs substrate 11 by known photolithographic technique by utilizing an etchant containing sulfuric acid. Then by means of a liquid phase epitaxial growth method, a first clad layer 12 of n-$Ga_{0.7}Al_{0.3}As$ is formed in a manner that at the parts above the thinner and thicker horizontal parts of the substrate 11 the first clad layer 12 is about 0.2 μm thick and that, at the part above the foot of the step part T, the first clad layer 12 is about 1 μm thick. The epitaxial growth of the first clad layer 21 is started at 845° C., the cooling rate is 0.3° C./minute and the growth of the first clad layer 21 is stopped at the temperature of 843° C., so that the 1 μm thickness is obtained on the foot of the step part T. Subsequently the active layer 13 of non-doped $Ga_{0.95}Al_{0.05}As$ is epitaxaially grown on the first clad layer, so that the layer has the oblique central region 131 defined between two smoothly curved bendings and that the oblique central region 131 has a uniform thickness of about 0.1 μm. In order to attain the abovementioned condition of growth, it is empirically found that the initial supercooling temperature should be 6°-8° C. Further subsequently, the second clad layer 14 of p-GaAlAs is epitaxially grown, in a manner to be about 0.4 μm thick at the horizontal parts and about 1.5 μm thick at the oblique part which is on the oblique central region 131. Subsequently the cap layer 21 of n-GaAs is epitaxially grown in a manner to be about 2.5 μm on the higher horizontal part of the active layer 13, thereby forming a flat and horizontal upper face as shown in FIG. 15. Such forming of different thickness is attained by the growth from the nearly saturated Ga-solution. Then, by use of a known mask of $SiO_2$ or $Si_3N_4$, an acceptor such as Zn is selectively diffused in a 3 μm width stripe-shaped pattern from the surface of the cap layer 21 to form a current injection region 22 of p-type conductivity.

Then, after removing the $Si_3N_4$ mask the p-side electrode 23 is formed by sequential sputtering of Ti, Pt and Au. Thereafter, the bottom face of the substrate 11 is chemically etched so that the overall thickness of the wafer becomes 100 μm, and an n-side ohmic electrode 17 is formed by vapor deposition of Au-Ge-Ni followed by alloying treatment. The laser manufactured by the abovementioned process has a stable lasing characteristic that with the width D=5 μm of lasing region, it can oscillate at a fundamental transverse mode continuous wave up to a large current 3 times as large as the threshold current in the room temperature.

In the laser of FIG. 15, there is no clear bendings between the oblique lasing region 131 and the neighboring horizontal regions of the active layer 13. Accordingly, the difference of the refractice indexes between the oblique lasing region 131 and other parts of the active layer 13 is induced only by the difference of the first clad layer. Therefore, the difference of the refractice index is small as of the order of $10^{-3}$. Accordingly, even when the width between two bendings is extended to about 5 μm, there is no fear of inducing higher modes of oscillation, and hence a stable single fundamental transverse mode oscillation is possible.

FIG. 16(a) to FIG. 16(e), FIG. 17(a) to FIG. 17(b) and FIG. 18(a) to FIG. 18(b) show examples of manufacturing method which are suitable for manufacturing the lasers shown in FIG. 10 to FIG. 15.

Figure 16A:
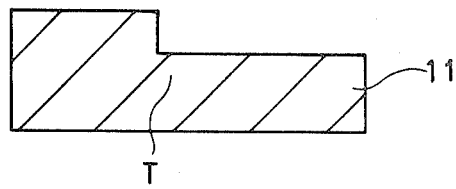
FIG. 16(a), FIG. 16(b), FIG. 16(c), FIG. 16(d) and FIG. 16(e) are sectional elevation views showing manufacturing steps of still another example.
Figure 16B:
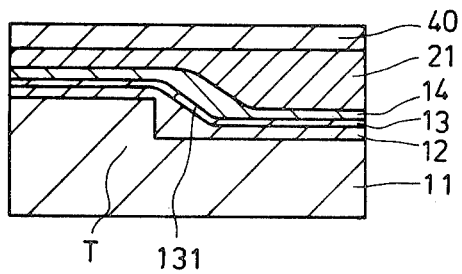
Figure 16C:
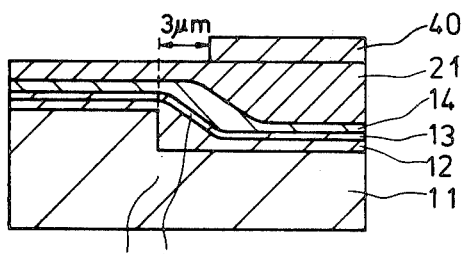
Figure 16D:
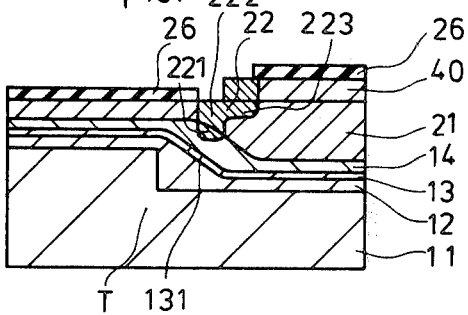

FIG. 16(a) to FIG. 16(e) show a manufacturing process of a laser. The structure is: on
a terraced substrate 11 of ... n-GaAs having 1.5 μm high terrace step T, the following layers are formed by a sequential liquid at the oblique part which is above the oblique central region 131. Subsequently the cap layer 21 of n-GaAs is epitaxially grown in a manner to be about 2.5 μm on the lower horizontal part of the active layer 13 and about 1 μm on the higher horizontal part of the active layer 13, thereby having a p-n isolation junction with two bendings between the active layer 14 and the cap layer 21. Then, an additional layer 40 of n-$Ga_{0.35}Al_{0.65}As$ is sequentially grown to 1.5 μm, thickness as shown in FIG. 16(b). Then, the additional layer 40 is selectively removed from the part around above the central line of the lasing region 131 to the part above the end of the thicker part of the substrate 11, as shown in FIG. 16(c). That is, the gap between the selective etched end of the additional layer 40 and the step of the substrate is selected to be 3 μm. Then, a diffusion mask 26 of $Si_3N_4$ is formed over the second clad layer 21 and a 5 μm width stripe-shaped opening is formed in a position as shown in FIG. 16(d), and exposes the upper face of the cap layer 21 by 2 μm. Then an acceptor such as Zn is selectively diffused in the stripe-shaped pattern from the surface of the cap layer 21 to form a current injection region 22 of p-type conductivity, in a manner that the depth of the diffusion is so controlled that the corner edge 221 of the diffused region 22 which is near the oblique central region 131 penetrates the cap layer 21 and intrudes into the second clad layer 14 at the part around above the center line of the oblique central region 131, thereby to form an ohmic junction between the layer 14 and region 22. Thereby, the diffused region 22 is formed as shown phase epitaxial growth:
a first clad layer 12 of ... n-$Ga_{0.7}Al_{0.3}As$,
an active layer 13 of ... n-$Ga_{0.95}Al_{0.05}As$,
a second clad layer 14 of ... p-$Ga_{0.7}Al_{0.3}As$,
a cap layer 15 of ... p-GaAs,
an additional layer 40 of ... n-$Ga_{0.35}Al_{0.65}As$. as shown by FIG. 16(b).

Figure 16E:
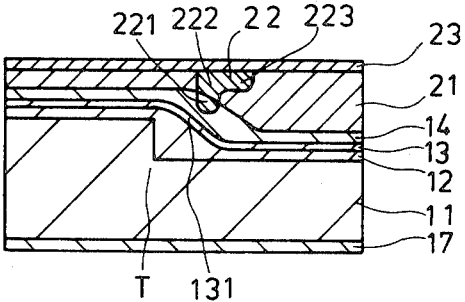

A step of 1.5 μm height in <011> direction is formed on the (100) face of an n-GaAs substrate 11 by known photolithographic technique by utilizing an etchant containing sulfuric acid. Then by means of a liquid phase epitaxial growth method, a first clad layer 12 of n-$Ga_{0.7}Al_{0.3}As$ is formed, in a manner that at the parts above the thinner and thicker horizontal parts of the substrate 11 the first clad layer 12 is formed about 0.2 μm thick and that, at the part above the foot of the step part T, the first clad layer 12 is formed about 1 μm thick. Such thickness can be obtainable as a result that growth rate is higher at the step part. Subsequently, the active layer 13 of non-doped $Ga_{0.95}Al_{0.05}As$ is epitaxially grown on the first clad layer 12, so that the active layer 13 has the oblique central part 131 defined between an upper bending and the lower bending, and that the oblique central region 131 is of about 0.1 μm thickness thicker than horizontal parts of the active layer 13 of about 0.08 μm thickness. Further subsequently, the second clad layer 14 of p-$Ga_{0.65}Al_{0.35}As$ is epitaxially grown, in a manner to be about 0.4 μm thick at the horizontal parts and about 1.5 μm thick in FIG. 16(d). Thereafter, the diffusion mask 26 and the additional layer 40 are removed and the p-side electrode 23 is formed by sequential sputtering of Ti, Pt and Au. Thereafter, the bottom face of the substrate 11 is chemically etched so that the overall thickness of the wafer becomes 100 μm, and an n-side ohmic electrode 17 is formed by vapor deposition of Au-Ge-Ni followed by alloying treatment, as shown by FIG. 16(e).

The laser manufactured by the abovementioned process can lase at such a low threshold current as 40 mA in room temperature continuous wave oscillation and attains such high external differential quantum efficiency ($\eta$ext) of about 35%.

Figure 17A:
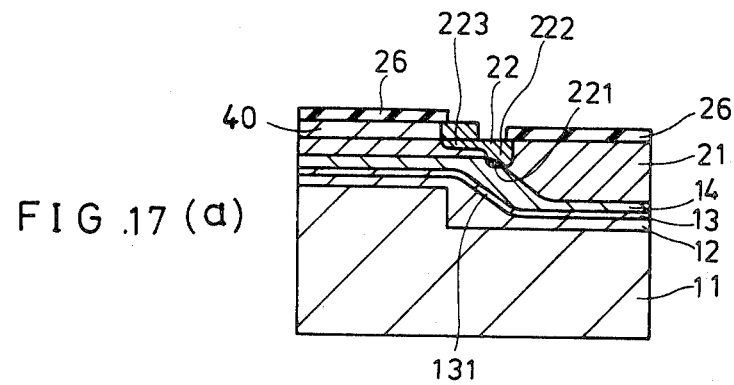
FIG. 17(a) and FIG. 17(b) are sectional elevation views showing manufacturing steps of still another example.
Figure 17B:
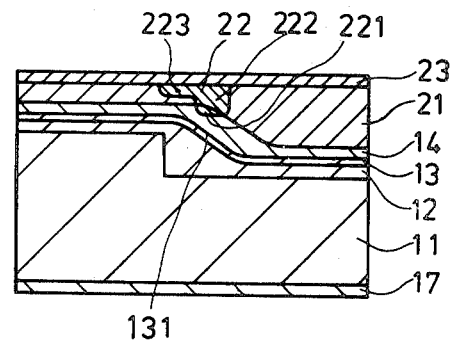
Figure 18A:
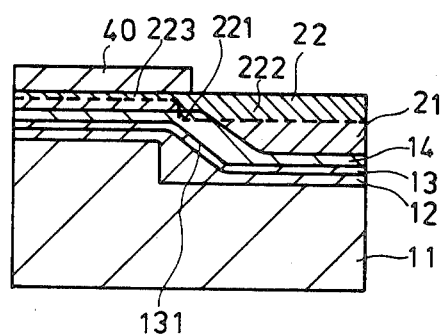
FIG. 18(a) and FIG. 18(b) are sectional elevation views showing manufacturing steps of still another example.
Figure 18B:
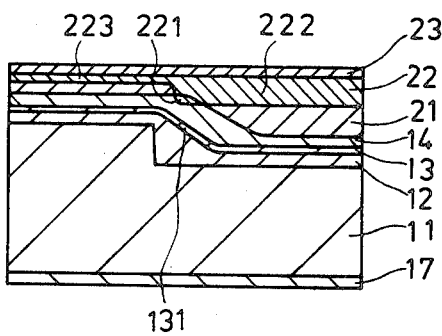

FIG. 17(a) and FIG. 18(b) show a variation step to be followed to the step of FIG. 16(b). That is, after forming the epitaxial growth as FIG. 16(b), the additional layer 40 is etched as shown by FIG. 17(a) and diffusion to form the diffused region 22 is made as shown by FIG. 17(b). And the laser is similarly completed by removing the mask 26 and the additional layer 40, followed by forming the electrodes 23 and 17.

FIG. 18(a) and FIG. 18(b) show another variation from the step of FIG. 16(b). That is, instead of forming a mask, the acceptor Zn is diffused on all the face of the wafer, so that the diffused region 22 is formed in the shape as shown in FIG. 18(b). Thereafter, by removing the additional layer 40 and forming electrodes 23 and 17, the laser of FIG. 18(b) is completed.

In the examples of FIGS. 16(e), 17(b) and 18(b), the narrow current injection regions 221 are easily formed by using the additionally epitaxial grown layer 40 as a mask, and therefore the laser of small threshold current and good light confinement is easily obtained with comparably few number of steps.

Figure 19:
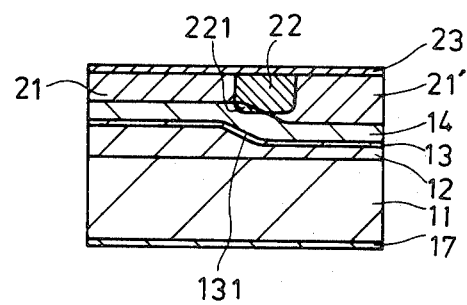
FIG. 19 is a sectional elevation view of still another example.
Figure 20A:
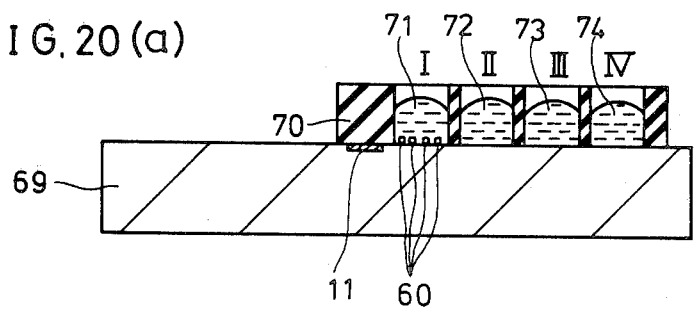
FIG. 20(a) is a sectional elevation view of an apparatus for manufacturing still another example of lasers.
Figure 20B:
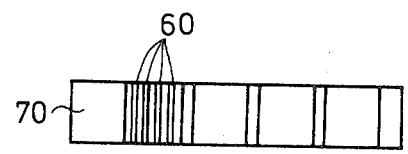
FIG. 20(b) is a bottom view of a solution tubs of the apparatus of FIG. 20(a).

FIG. 19 and FIG. 20(a) and FIG. 20(b) show another example, wherein, there is no need of preliminary etching the substrate to form the terrace shape, and further very narrow width of the oblique lasing region is easily obtainable with a simple process.

Figure 21A:
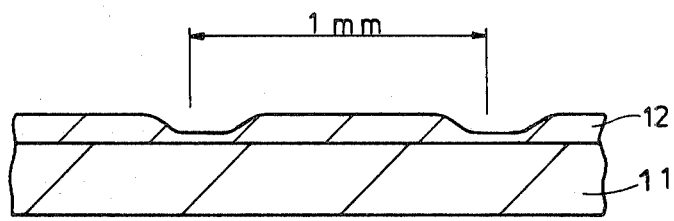
FIG. 21(a), FIG. 21(b), FIG. 21(c) and FIG. 21(d) are sectional elevation views showing manufacturing steps of the laser by utilizing the apparatus of FIG. 20(a) and FIG. 20(b).
Figure 21B:
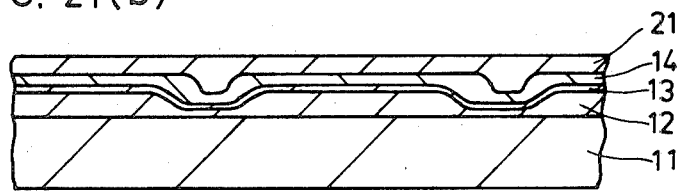
Figure 21C:
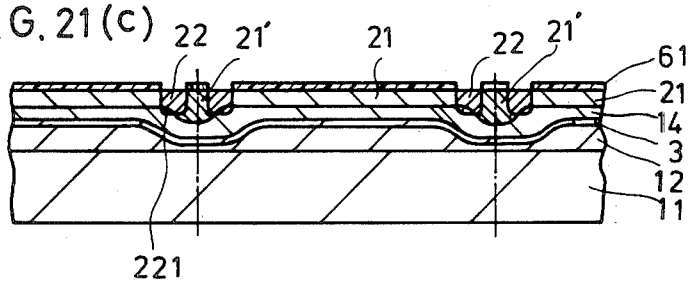
Figure 21D:
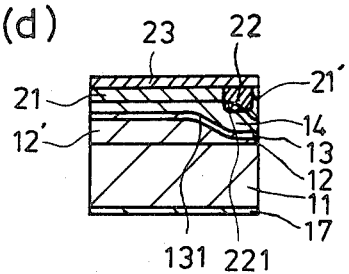

The laser of FIG. 19 manufactured by the crystal growing apparatus shown by FIG. 20(a) of its sectional elevation view. FIG. 20(b) is a bottom view of the solution container 70 of FIG. 20(a). The solution container 70 has many tub I, II . . . to contain Ga solutions 71, 72, . . . . The first tub I which contains a solution to form n-Ga$_{1-x}$Al$_x$As has several carbon rods 60 of about 500 $\mu$m width at its bottom. When the solution is put over the n-GaAs substrate at the temperature of 840° C., the first clad layer 12 of n-Ga$_{1-x}$Al$_x$As is grown on the substrate. Because of the existence of rods 60, the thickness of the first clad layer 12 under the rod becomes thinner than other parts by about 1 $\mu$m. Accordingly, the as shown by FIG. 21(a), the first clad layer 12 is grown having recesses at a predetermined pitch. Thereon, an active layer 13 of non-doped Ga$_{1-y}$Al$_y$As, a second clad layer 14 of p-Ga$_{1-x}$Al$_x$As and a cap layer p-GaAs are grown sequentially by contacting the solutions 72, 73 and 74 to the substrate 11. Therefore, as shown in FIG. 21(b), the active layer 13 has a curved shape. The thicknesses of the oblique parts and horizontal or flat parts of the active layer 13 can be controlled uniform and equal by controlling the supercooling at the growth of the active layer 13. After the epitaxial growth, an SiO$_2$ mask 61 is formed on the wafer and stripe-shaped openings are formed at the parts above the oblique regions of the active layer 13. Then an acceptor such as Zn is diffused through the openings, in a manner to form current injection regions 22 of p-type conductivity. The depth of the diffusion is so controlled that the corner edges 221 of the diffused regions 22, which are near the oblique central region 131, penetrates the cap layer 21 and intrudes into the second clad layer 14 at the part around above the center line of the oblique central region 131, thereby forming an ohmic junction between the layer 14 and the region 22. Thereby, the diffused regions are formed as shown by FIG. 21(c). Thereafter, the diffusion mask 61 is removed and a p-side and an n-side electrodes 23 and 17 are formed. After cutting the wafer at the chain lines of FIG. 21(c) into individual laser elements, the laser is completed as shown in FIG. 19. The laser of FIG. 19 has an active layer 13 curving at an arbitrary curvature. Furthermore, the first clad layer 12 can be a uniform thickness. By such features, the difference of the refractive index of the active layer 13 can be made small, as about 10$^{-3}$, and therefore, even when the width between the bendings of the lasing regions is extended to 10 $\mu$m, the single mode fundamental oscillation is obtainable.

What is claimed is:

1. In a semiconductor laser:
   a terraced-shaped semiconductor substrate having a thinner part and a thicker part with a step inbetween,
   a first clad layer which is formed on said substrate and has a lower part formed on said thinner part, an upper part formed on said thicker part and a central part formed to connect said lower part and said upper part, having an oblique upper face with respect to the principal face of said substrate and having a larger thickness than those of said lower part and said upper part,
   an active layer formed on said first clad layer and having a horizontal lower part formed on said lower part of said first clad layer, a horizontal upper part formed on said upper part of said first clad layer and an oblique central region as a lasing region formed on said central part of said first clad layer and connecting said horizontal lower part and said horizontal upper part therewith with a lower bending and an upper bending inbetween, and
   a second clad layer formed on said active layer, characterized in that
   a current injection region of a stripe-shaped pattern is formed penetrating said second clad layer to contact the latter at a part above said oblique central region of said active layer, and to form an ohmic junction with a width smaller than a width of said oblique central region.

2. A semiconductor laser in accordance with claim 1, wherein a width of said current injection region is smaller than a width in plan view of said oblique central region.

3. A semiconductor laser in accordance with claim 1, which further comprises
   another epitaxial layer which is disposed immediately on said second clad layer and has an opposite conductivity type to that of said second clad layer, and said current injection region being formed through said another epitaxial layer as a third clad layer and having the same conductivity type thereto.

4. In a semiconductor laser:
   a terraced-shape semiconductor substrate having a thinner part and a thicker part with a step inbetween,
   a first clad layer which is formed on said substrate and has a lower part formed on said thinner part, an upper part formed on said thicker part and a central part formed to connect said lower part and said upper part, having an oblique upper face with respect to the principal face of said substrate and having a larger thickness than those of said lower part and said upper part,
   an active layer formed on said first clad layer and having a horizontal lower part formed on said lower part of said first clad layer, a horizontal upper part formed on said upper part of said first clad layer and an oblique central region as a lasing region formed on said central part of said first clad layer and connecting said horizontal lower part and said horizontal upper part therewith with a lower bending and an upper bending inbetween, and a second clad layer formed on said active layer, characterized in that a current injection region of a stripe-shaped pattern is formed penetrating said second clad layer to contact the latter at a part above said oblique central region of said active layer, and to form an ohmic junction with a width smaller than a width of said oblique central region, and wherein said oblique central region of said active layer has a section of a shape of a section of a convex lens.

5. A semiconductor laser in accordance with claim 1, wherein said second clad layer has a step shaped upper face.

6. A semiconductor laser in accordance with claim 1, wherein said lower bending and said upper bending of said active layer are of a smooth curvature.

7. In a semiconductor laser:
a terraced-shape semiconductor substrate having a thinner part and a thicker part with a step inbetween,
a first clad layer which is formed on said substrate and has a lower part formed on said thinner part, an upper part formed on said thicker part and a central part formed to connect said lower part and said upper part, having an oblique upper face with respect to the principal face of said substrate and having a larger thickness than those of said lower part and said upper part,
an active layer formed on said first clad layer and having a horizontal lower part formed on said lower part of said first clad layer, a horizontal upper part formed on said upper part of said first clad layer and an oblique central region as a lasing region formed on said central part of said first clad layer and connecting said horizontal lower part and said horizontal upper part therewith with a lower bending and an upper bending inbetween, and
a second clad layer formed on said active layer, characterized in that a current injection region of a stripe-shaped pattern is formed penetrating said second clad layer to contact the latter at a part above said oblique central region of said active layer, and to form an ohmic junction with a width smaller than a width of said oblique central region, and wherein at least one of said lower bending part and said upper bending part of said active layer are thinner than the other part of said active layer.

8. A semiconductor laser in accordance with claim 1, wherein said oblique central region is formed obliquely with respect to the face of said thinner part of said substrate on a part of said step of said substrate.

9. A semiconductor laser in accordance with claim 1, wherein said semiconductor substrate, said active layer and said first and second clad layers are of a III-V compound semiconductor.

10. A semiconductor laser in accordance with claim 1, wherein a specific resistivity of said second clad layer is $10^{-2}\Omega\cdot cm$ or higher.

11. A semiconductor laser in accordance with claim 1, wherein said second clad layer has an oblique part on said oblique central part of said active layer, and in said second clad layer said oblique part is thicker than other parts.

12. A semiconductor laser in accordance with claim 3, wherein the upper face of said second clad layer has an oblique part above said oblique central region, where said current injection region contacts.

13. A semiconductor laser in accordance with claim 3, wherein said another layer consists of two layers of a same conductivity type.

14. In a semiconductor laser:
a terraced-shape semiconductor substrate having a thinner part and a thicker part with a step inbetween,
a first clad layer which is formed on said substrate has a lower part formed on said thinner part, an upper part formed on said thicker part and a central part formed to connect said lower part and said upper part, having an oblique upper face with respect to the principal face of said substrate and having a larger thickness than those of said lower part and said upper part,
an active layer formed on said first clad layer and having a horizontal lower part formed on said lower part of said first clad layer, a horizontal upper part formed on said upper part of said first clad layer and an oblique central region as a lasing region formed on said central part of said first clad layer and connecting said horizontal lower part and said horizontal upper part therewith with a lower bending and an upper bending inbetween, and
a second clad layer formed on said active layer, characterized in that a current injection region of a stripe-shaped pattern is formed penetrating said second clad layer to contact the latter at a part above said oblique central region of said active layer, and to form an ohmic junction with a width smaller than a width of said oblique central region, another epitaxial layer which is disposed immediately on said second clad layer and has an opposite conductivity type to that of said second clad layer, and said current injection region being formed through said another epitaxial layer as a third clad layer having the same conductivity type thereto, and wherein a junction between said second clad layer and said another epitaxial layer has a bending part on said bending of said active layer and a lower corner edge of said current injection region which is nearer to said oblique central region intrudes into said junction and the other lower corner edge remains in said second clad layer.

15. A semiconductor laser in accordance with claim 3, wherein said current injection region is a Zn-diffused region.

* * * * *